United States Patent [19]

Rushforth et al.

[11] Patent Number: 4,901,317

[45] Date of Patent: Feb. 13, 1990

[54] EFFICIENT MAXIMUM-LIKELIHOOD DECODER FOR THE GOLAY (24,12) CODE

[75] Inventors: Craig K. Rushforth, Kaysville; Ayyoob D. Abbaszadeh, Salt Lake City, both of Utah

[73] Assignee: Unisys Corp., Blue Bell, Pa.

[21] Appl. No.: 231,125

[22] Filed: Aug. 11, 1988

[51] Int. Cl.[4] .............................................. G06F 11/10
[52] U.S. Cl. .................................. 371/37.1; 371/37.4
[58] Field of Search ..................... 371/37.1, 37.2, 37.4, 371/37.5, 37.7, 38.1, 39.1, 44, 40.1, 40.3

[56] References Cited

U.S. PATENT DOCUMENTS

| | | | |
|---|---|---|---|
| 4,397,022 | 8/1983 | Wong | 371/37.1 |
| 4,414,667 | 11/1983 | Bennett | 371/37.1 |
| 4,613,860 | 9/1986 | Currie | 371/37.1 |
| 4,648,091 | 3/1987 | Gajjar | 371/37.4 |

OTHER PUBLICATIONS

Hackett, C. M., "An Efficient Algorithm for Soft-Decision Decoding of the (24,12) Extended Golay Code", IEEE Transactions on Communications, vol. Com, 29, No. 6, Jun. 1981.

Primary Examiner—Michael R. Fleming
Attorney, Agent, or Firm—John B. Sowell; Robert S. Bramson; Mark T. Starr

[57] ABSTRACT

A novel maximum likeihood decoder for the Golay (24,12) code is provided. Instead of decoding the received dimensional vector (X) is a systolic array, the vector is mapped into a (24,5) subcode with an index 128 which is easily decoded. The decoder employs a plurality of precomputational circuits cooperating with a similar plurality of inner product circuits which compute the 128 inner product values and select the maximum inner product value from each inner product circuit. The maximum inner product value from each circuit is loaded into a select logic circuit for selecting the maximum inner product value and its corresponding code word closest to the received vector (X).

18 Claims, 7 Drawing Sheets

EFFICIENT MAXIMUM-LIKELIHOOD DECODER FOR THE GOLAY (24,12) CODE

BACKGROUND OF THE INVENTION

Related Applications

This application is related to our co-pending application Ser. No. 248,866 filed 10/23/88 for an application entitled "An Apparatus for Fast Decoding on a Non-Linear Code".

FIELD OF THE INVENTION

This invention relates to a structural implementation of a Golay decoder. More particularly, the present invention relates to an efficient structural implementation for a Golay (24,12) decoder which may be efficiently implemented on two semiconductor chips and may be incorporated into a single hip by employing the latest state of the art technology.

DESCRIPTION OF THE PRIOR ART

It is possible to decode any code such as the present Golay (24,12) code by computing the inner product between the received vector and each word in the code to determine the most probable transmitted code word. If this straightforward computational approach is used for the present Golay (24,12) code, it would require approximately forty-five thousand addition steps plus two thousand and forty-seven comparison steps in order to decode a single receive signal. In order to speed up the process of decoding and decrease the amount of hardware required, it is necessary to derive a different and more efficient algorithm.

In our aforementioned co-pending application Ser. No. 248,866 application, there is disclosed a structural implementation that requires significantly fewer computations than the straightforward approach.

J. H. Conway and N. J. A. Sloane in their paper entitled, Soft Decoding Techniques for Codes and Latices, Including the Golay Code and the Leach Lattice, IEEE Transactions, Information Theory, Vol. 19-28, 1986, discuss a more efficient algorithm for decoding the Golay (24,12) code. However, this article does not show or describe a structural implementation for the suggested algorithm.

C. M. Hackett, in his article entitled, An Efficient Algorithm for Soft-Decision Decoding of the (24,12) Extended Golay Code in IEEE Transactions on Communications, Vol. Com, 29, No. 6, Jun. 1981, describes a soft-decision decoder algorithm for the (24,12) Extended Golay Code but does not show or suggest any hardware implementation. The algorithm presented in this paper is not an exact maximum likelihood decoding algorithm but presents an approximation thereof.

It would be extremely desirable to provide an efficient maximum likelihood decoder for the Golay (24,12) code which is implemented in hardware. Moreover, it is extremely important that the hardware implementation embody speed and maximum efficiency so that it may be incorporated into a minimum number of semiconductor chips.

SUMMARY OF THE INVENTION

A principal object of the present invention is to provide a structural implementation of a Golay (24,12) decoder.

Another principal object of the present invention is to provide a structural implementation of a Golay (24,12) decoder employing similar basic logic elements throughout the decoder.

It is another principal object of the present invention to provide a hardware implementation of a Golay (24,12) decoder which employs simple logic computation elements for adding, comparing and storing elements.

It is another principal object of the present invention to provide a simple system control circuit which basically comprises a plurality of counters and a clock which synchronize the operation of the decoder.

It is another general object of the present invention to provide a Golay (24,12) decoder which is divided into two functional elements which comprise a precomputational chip circuit and an inner product chip circuit.

Another general object of the present invention is to basically divide the inner product chip into eight cells, each of which performs decoding for sixteen cosets.

It is another general object of the present invention to interconnect the precomputational chip circuit and the inner product chip circuit in a pipeline fashion to increase the speed of operation.

It is another general object of the present invention to provide a decoder structure organized in a pipeline architecture consisting of four segments. A first segment is provided for receiving serial data and loading the data into bit-parallel registers in the precomputational chip. In the second segment, data circuits in the precomputational chip calculate and store information employed for the decoding operation. In the third segment, the inner product chip calculates the inner products and their corresponding code words. In the fourth and last segment in the pipeline, select circuits in the inner product chip determine the final estimated code word.

In accordance with these and other objects of the present invention there is provided an efficient maximum likelihood decoder for the Golay (24,12) code which comprises a precomputational chip and an inner product chip. The precomputational chip (PCC) includes a PCC system controller, bit serial adders and RAM storage memory for storing the precomputational values. The inner product chip (IPC) includes the IPC system controller, eight identical processing elements and associated ROM storage which enable the inner product chip to determine the maximum inner product and to select the maximum likelihood code word.

DESCRIPTION OF THE PREFERRED EMBODIMENT

Figure 1:
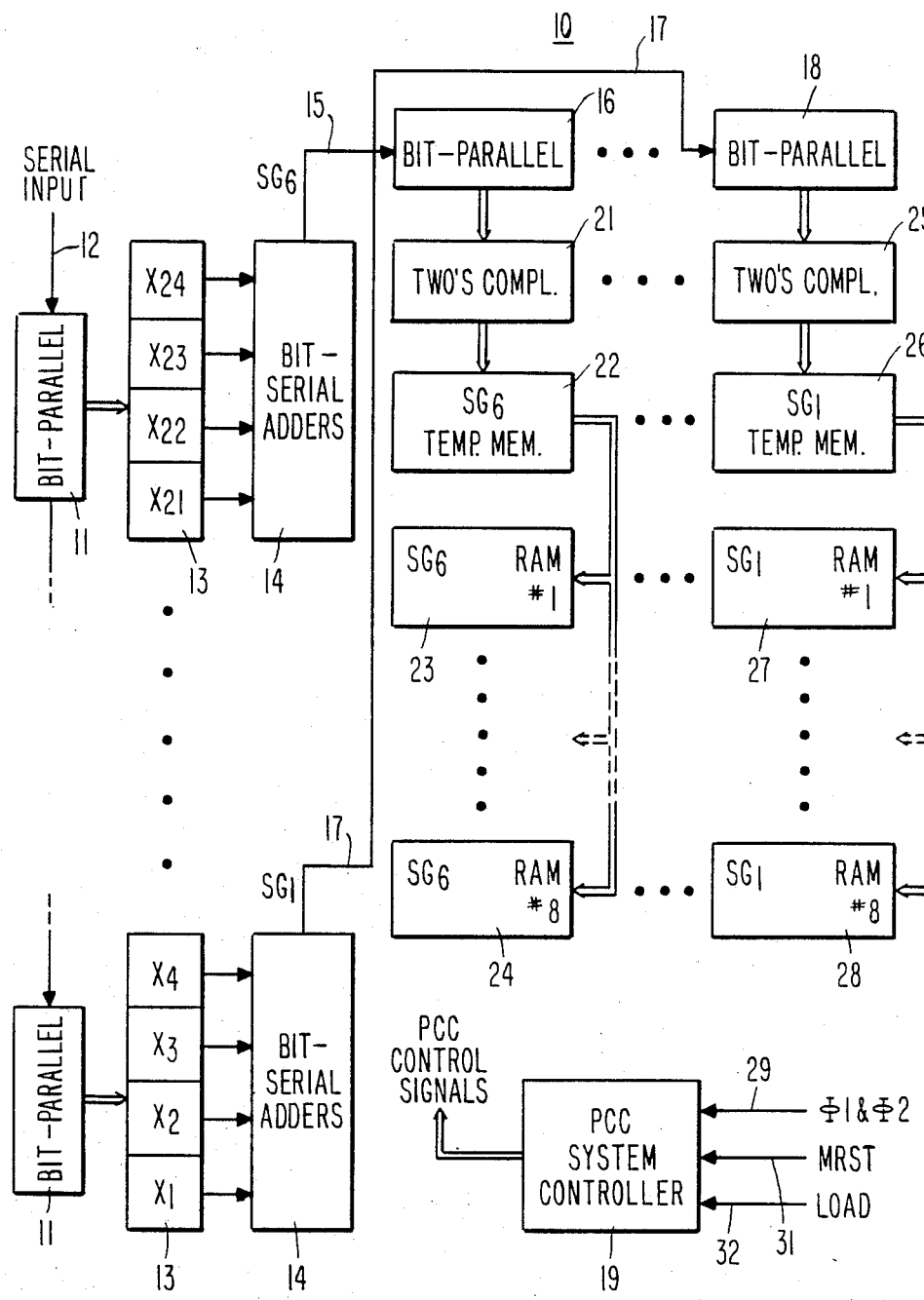
FIG. 1 is a block diagram of the preferred embodiment precomputational chip showing the bit serial adders, the precomputational storage elements, and the PCC system controller.

Refer now to FIG. 1 showing a block diagram of the preferred embodiment precomputational (PCC) circuit 10 which comprises a series to parallel register 11 for receiving the input data stream on line 12. Assume that the input data stream is a 24-dimensional vector which has been quantized at each of the coordinates of the 24 dimensions and each dimension is represented by a plurality of bits. The quantized numbers are stored in the 24 registers designated $X_1$ to $X_{24}$ shown as elements 13. The quantized bits in registers 13 are coupled to the input of bit serial adders 14 in groups of four to produce outputs on line 15 designated $SG_K$ where K runs from one to six in the illustration shown. The output $SG_6$ on line 15 is connected to a bit parallel register 16 and the output designated $SG_1$ on line 17 is connected to bit parallel register 18. The PCC system controller 19 causes the information stored in the bit parallel register 16 to be complemented in two's complement block 21 and stored in the temporary memory 22 before being stored in one of the eight RAM registers 23 etc. 24, and will be explained in greater detail hereinafter. The PCC system controller 19 selects the eight possible combinations of plus and minus signs which can be associated with the $X_Y$ shown as $X_{21}$ through $X_{24}$ before being added in bit serial adder 14 to form the $SG_K$'s as will be explained in detail. Similarly, the $SG_K$'s from the bit serial adder 14 associated with the $X_I$ registers 13 shown as $X_1$ to $X_4$ supply their $SG_K$, shown as $SG_1$ on line 17 to bit parallel register 18. The information in bit parallel register 18 is two's complemented in complementer 25 before being stored in $SG_1$ temporary memory 26. As explained hereinbefore, the information in memory 26 is supplied to one of the eight $SG_1$ registers 27 etc. 28 as a result of the output from bit register 14 adding the different combinations supplied by registers $X_1$ to $X_4$. A two-phase clock is supplied to the system controller 19 on line 29. The master reset signal on line 31 and load signal on line 32 are supplied from the inner product circuit which will be explained later.

Figure 2:
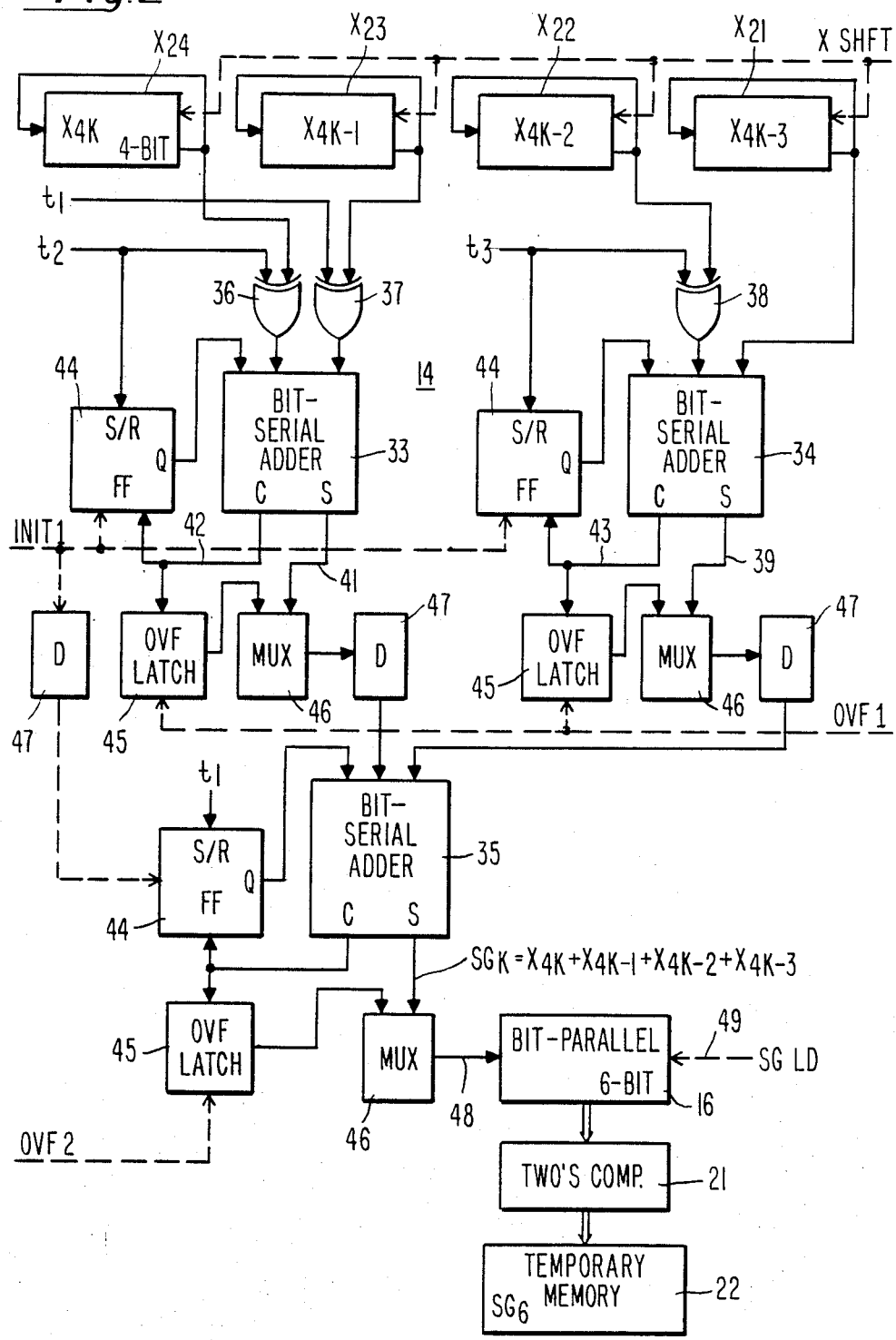
FIG. 2 is a more detailed block diagram showing the details of the bit serial adders of FIG. 1.

Refer now to FIG. 2 which is a more detailed block diagram of the bit serial adder 14 shown in FIG. 1. It will be understood that each of the bit serial adders 14 shown in FIG. 2 includes individual bit serial adders 33, 34 and 35. To maintain correlation between FIG. 1 and FIG. 2, the registers shown as four bit registers are numbered $X_{21}$ to $X_{24}$, similar to the register 13 in FIG. 1. The output of the four $X_I$ registers are applied directly to exclusive OR gates 36, 37 and 38 or bit serial adder 34 to perform the addition functions. The control signal shown as $T_1$, $T_2$ and $T_3$ are applied to the exclusive OR gates 36, 37 and 38 to control the sequence of inputs from the registers $X_{21}$ to $X_{24}$ to the bit serial adders 33 and 34 to produce the intermediate sums on lines 39 and 41 from bit serial adders 34 and 33. The carry from bit serial adders 33 and 34 is produced on lines 42 and 43. The control signals $T_1$ to $T_3$ also control the set/reset flip-flops 44 and their associated overflow latches 45, multiplexers 46 and delays 47 to produce the $SG_K$'s associated with a particular pattern of plus and minus signs for the values $S_{21}$ thru $S_{24}$ shown in FIG. 2 where $SG_K = X_{4K} \pm X_{4K-1} \pm X_{4K_2} \pm X_{4K-3}$.

The resulting $SG_K$ from the bit serial adders appears on line 48 at the output of the selection multiplexer 46 to bit parallel register 16 which receives a SG load signal on line 49 from the PCC controller. The value in the bit parallel register 16 is stored in temporary memory 22 in its two's complement form without a sign change. The temporary memory 22 holds one of the eight possible combinations of the value $SG_6$ until it is stored in one of the eight RAM registers 23 etc. 24 shown in FIG. 1.

Figure 3:
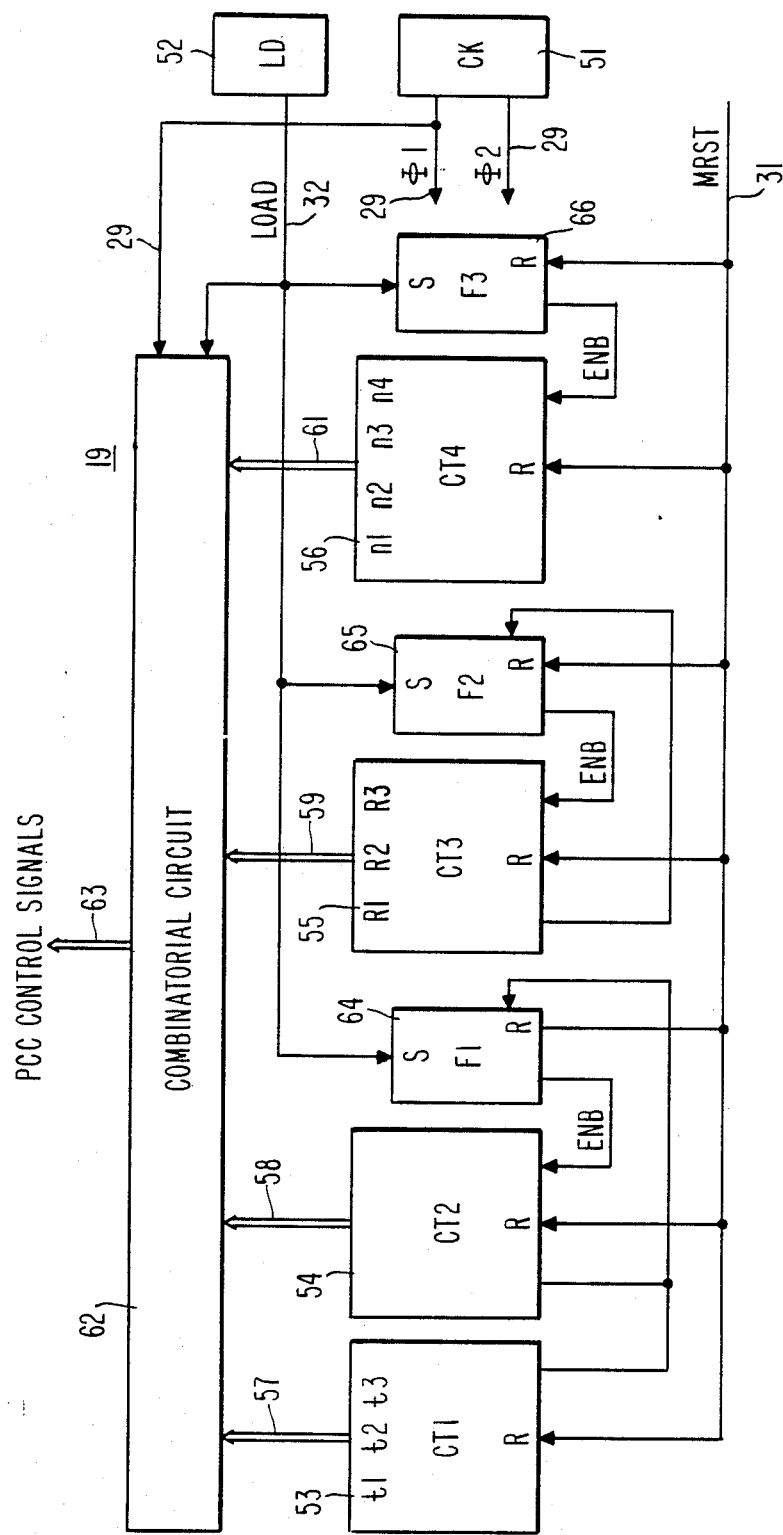
FIG. 3 is a more detailed block diagram showing the details of the PCC system controller of FIG. 1.

Refer now to FIG. 3 showing a more detailed block diagram of the precomputational circuit system controller. The preferred embodiment precomputational circuit system controller 19 operates under the control of external timing signals generated at clock 51 and load logic circuit 52 which are connected to the counters 53 to 56 that produce control signals like the control signals $T_1$, $T_2$ and $T_3$ on the output control busses 57 to 61. The outputs of the counter on control busses 57 to 61 are applied to the combinatorial circuit logic to provide the necessary PCC control signals on bus 63 which provide the necessary control and timing signals for the PCC system. The counters 53 to 56 are enabled by the MRST signal on line 31 operating in conjunction with the enable flip-flops 64, 65 and 66.

Figure 4:
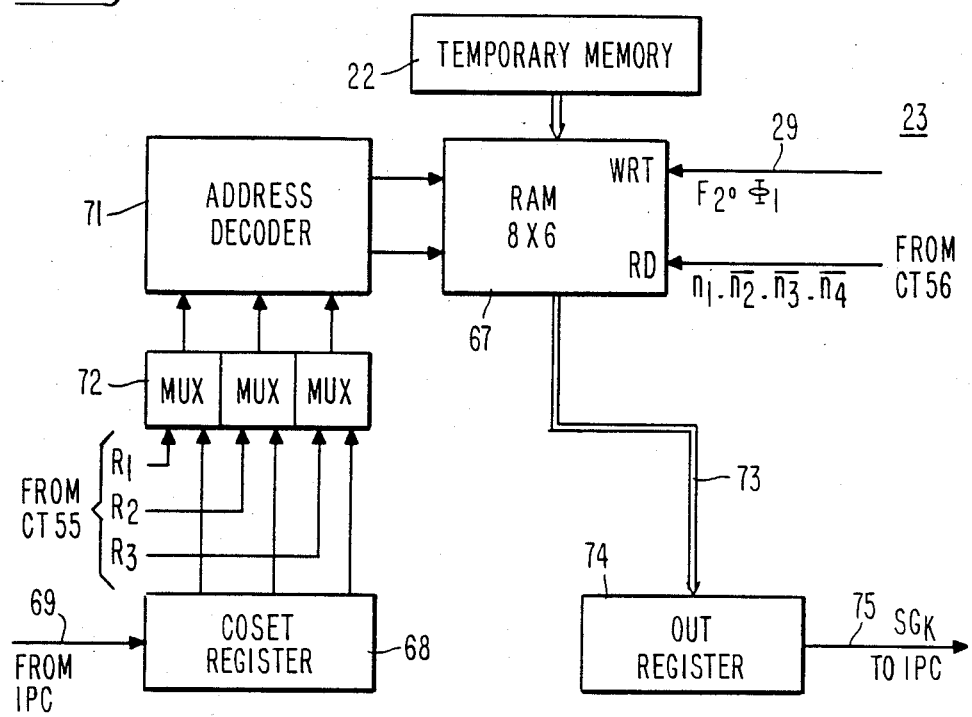
FIG. 4 is a more detailed block diagram showing the details of one of the RAM storage elements of FIG. 1.

Refer now to FIG. 4 which is a more detailed block diagram of one of the RAM storage elements similar to RAM 23. RAM storage element 67 is loaded from temporary memory 22 under control of the control signals from system controller 19 and the signals which originate at bus 63. The information in RAM 67 is accessed or read by first loading coset register 68 with information from the inner product circuit (IPC) and one of the lines 69 therefrom. An address is generated out of address decoder 71 under control of the control signals R1 to R3 and the output of coset register 68 operating in conjunction with the multiplexers 72. The information being read from RAM 67 is presented on bus 73 and stored in Out register 74 before being supplied as an SG value on line 75 to the inner product circuit shown in FIG. 5.

Figure 5:
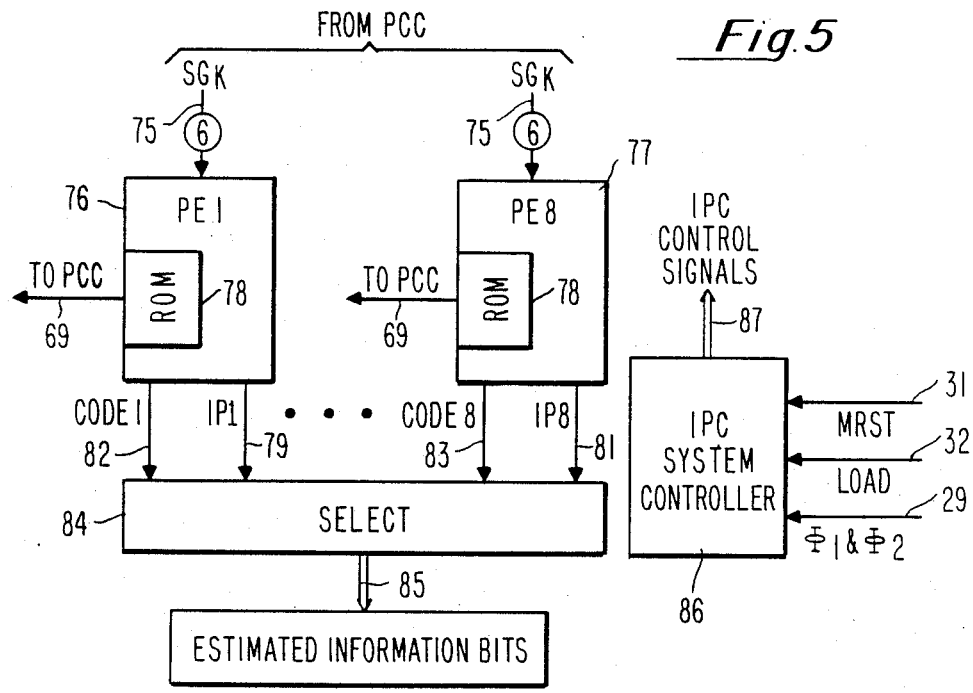
FIG. 5 is a block diagram of the preferred embodiment inner product chip showing the eight processing elements, their associated memory, the select circuits and the system controller.

Refer now to FIG. 5 which is a block diagram of the preferred embodiment inner product circuit (IPC) showing the eight processing elements, their associated ROM memory and the select circuits in the IPC system controller. The inner product circuit comprises eight identical processing elements 76 etc. 77, one of which will be explained hereinafter. The processing element 76 is provided with a ROM 78 which contains the coset leaders being supplied on line 69 to the coset register 68 in order to generate the address of one of the memory locations in RAM 67. The information in the address accessed in RAM 67 is supplied on bus 73 to out register 74 and on line or bus 75 as an input to the processing element 76. The SG information is used to calculate the inner products which are presented as an output on the eight output lines 79 etc. 81. The code word corresponding to the inner product values is presented on one of the eight output lines 82 etc. 83 as an input to the select circuits 84. The output of the select circuits on bus 85 comprise the estimated information bits which comprise the best estimate of the transmitted information.

The IPC system controller 86 is shown having input controlling timing signals defined hereinbefore to produce output IPC control signals on bus 87.

Figure 6:
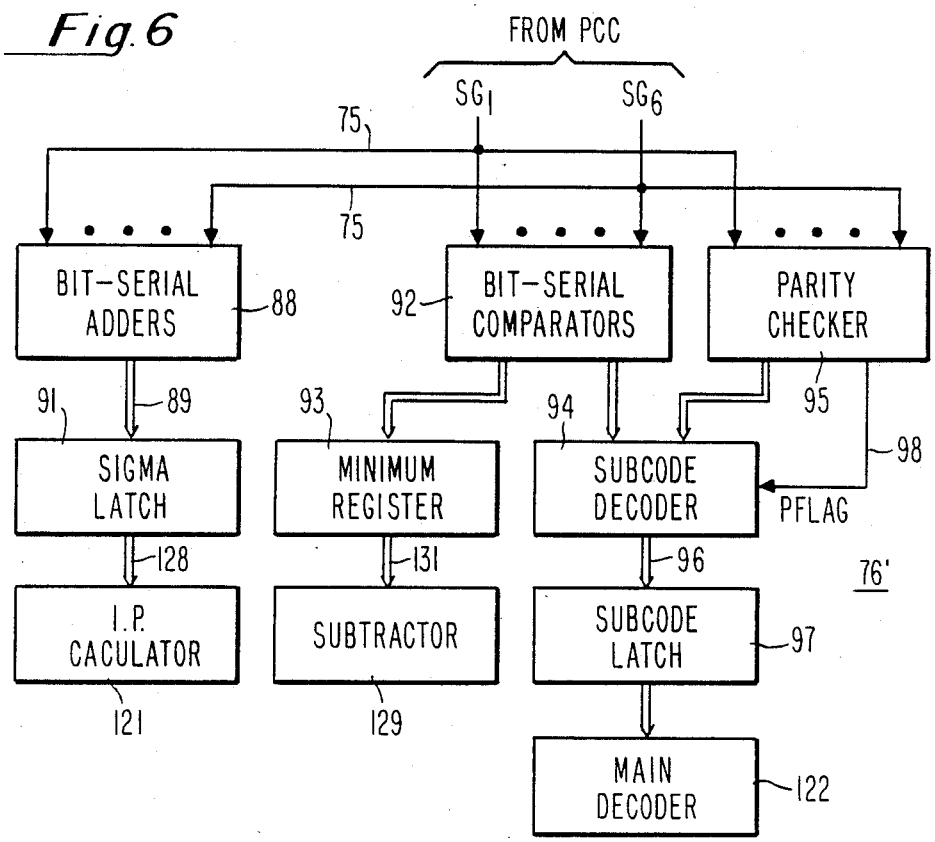
FIG. 6 is a more detailed block diagram of the add and compare circuits in the processing elements of FIG. 5.

Refer now to FIG. 6 which is a more detailed block diagram of one of the subsystems which perform the add and compare functions in the processing elements 76 and 77. The elements 76 comprise bit serial adders 88 which add the magnitudes of the SG1 through SG6 inputs on lines 75 to produce a sigma output on line 89 which is stored in sigma latch 91 until called for by the IPC circuits. The bit serial comparators 92 are employed to determine the $SG_K$ value which has the minimum magnitude and stores that value in minimum register 93 until called for by the IPC controller. The bit serial comparators 92 also provide the necessary input to the subcode decoder 94 along with the input from the parity checker 95 to provide the subcode output on bus 96 which is stored in subcode latch 97 identifying the minimum $SG_K$ value until called for by the IPC controller. The parity flag signal on line 98 from the counters in parity checker 95 is also supplied to the subcode decoder 94 in order to produce the proper subcode value on bus 96.

The structure shown in FIG. 6 calculates the value of SIGMA which is equal to the sum of the absolute values of the $SG_K$ on input lines 75 and is also equal to inner product value (IP) when the number of positive $U_K$ sign values is even. $U_K^{(j)} = \text{sign}(SG_K^{(j)})$ and when the positive $U_K$'s are even, $IP^{(j)} = SIGMA = |SG_1| + \text{---} + |SG_6|$.

For all other values, $IP^{(j)} = SIGMA - 2 \cdot \min_K(|SG_K^j|)$. The SIGMA value for each processing element 76, 77 etc. is stored in its SIGMA latch 91 and the minimum of the six absolute values $|SG_K|$ is stored in minimum register 93 with the sign reversed. The subcode decoder 94 is loaded with a subcode value which is stored in subcode latch 97. This subcode value is yet to be decoded into a (24,5) subcode which will identify the input dimensional vector X, but now contains the information necessary to make the next decoding step in the main decoder 122.

Figure 7:
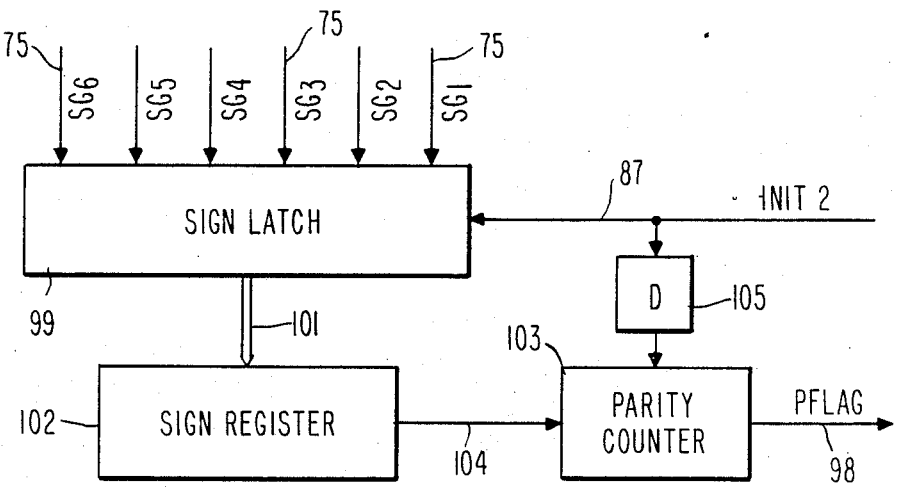
FIG. 7 is a more detailed block diagram of the parity checker shown in FIG. 6.

Refer now to FIG. 7 which is a more detailed block diagram of the parity checker 95 shown in FIG. 6. The $SG_K$ input line 75 are shown as inputs to the sign latch 99 which produces the signs of the $SG_K$'s on output bus 101 which is stored in the sign register 102. The information in sign register 102 is applied to the parity counter 103 via line 104 to produce a stored parity count shown as the parity flag (PFLAG) on output line 98. An initialization signal INIT2 from the IP system control bus 87 is shown being applied to sign latch 99 and also through delay 105 to parity counter 103 to produce the pority flag output signal on line 98.

Figure 8:
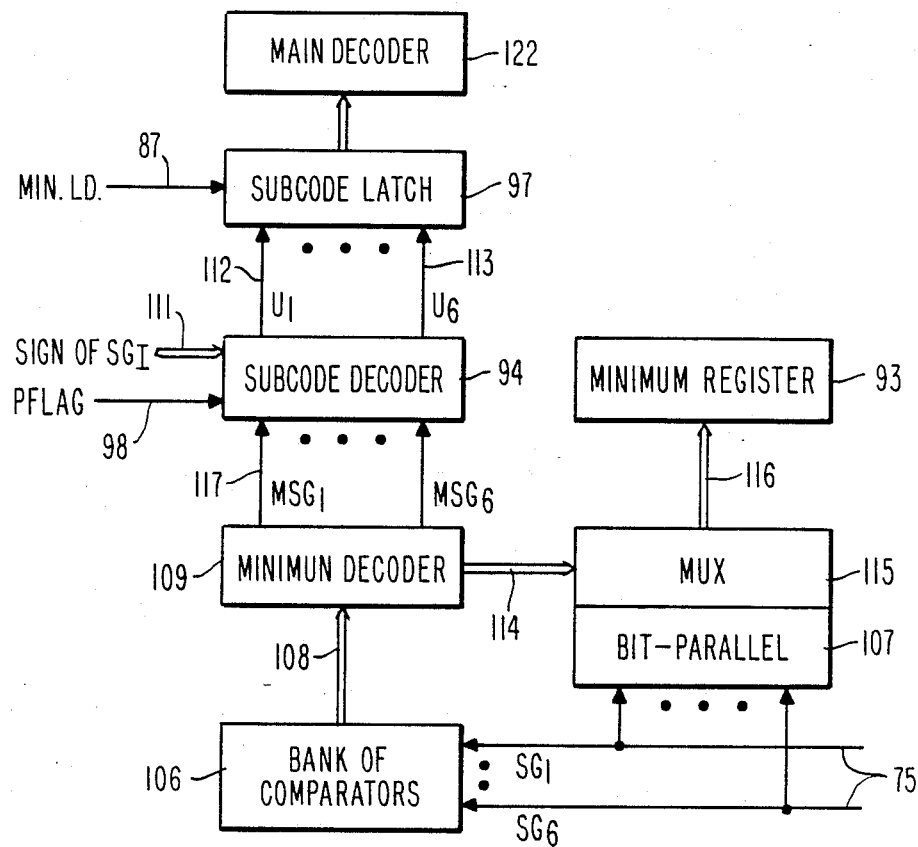
FIG. 8 is a more detailed block diagram of the bit serial comparators and subcode decoders of FIG. 6.

Refer now to FIG. 8 which is a more detailed block diagram of the bit serial comparators 92 and the subcode decoders 94 shown in FIG. 6. The same input lines 75 which are shown in FIGS. 6 and 7 are shown in FIG. 8 as inputs to the bank of comparators 106 and the bit parallel register 107. The bank of comparators 106 determine the minimum magnitude of the $SG_K$'s and supply this information on bus 108 to the minimum decoder 109 which holds this value in the decode register 109.

The minimum value in the decode register 109 is supplied to subcode decoder 94 which also has a sign input on line 111. The subcode decoder 94 provides outputs on lines 112 etc. 113 shown as $U_1$ to $U_6$ which are the signs of the associated $SG_K$'s appropriately modified by the input sign on bus 111 if the parity does not check. Stated differently, the $U_K$'s are the corresponding signs of the $SG_K$'s when the parity checks. However, if the parity does not check, the sign associated with the minimum magnitude $|SG_K|$ is changed. The $U_K$'s are then stored in the subcode latch 97 at the time indicated by control signal minimum load, which is one of the control signals from bus 87.

The output of the minimum decoder 109 is also supplied via bus 114 as a control signal to the multiplexer 115 in order to store the proper $SG_K$ magnitude in the minimum register 93 via bus 116.

Figure 9:
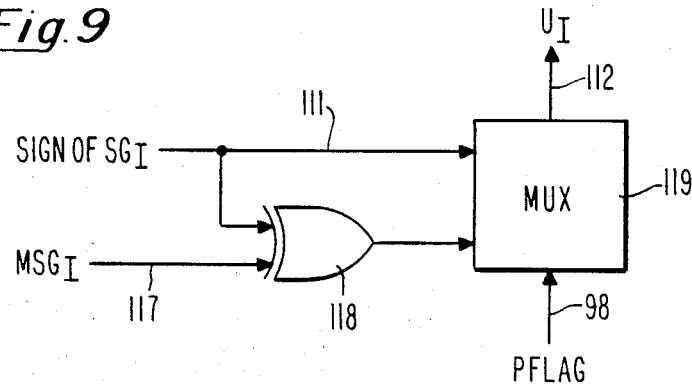
FIG. 9 is a detailed block diagram of the structure employed to determine the proper sign bits in the IPC chip.

Refer now to FIG. 9 which is a more detailed block diagram of the structure employed to determine the proper sign bits of information stored in the IPC circuit. The sign of the $SG_I$ value on line 111 in FIG. 8 is applied to exclusive OR gate 118 along with an $MSG_I$ signal minimum value on line 117. The signal on lines 111 and the output of exclusive OR circuit 118 are applied to multiplexer 119 along with the P-flag signal on line 98 to produce one of the properly adjusted sign signals shown as $U_I$ on line 112, also shown in FIG. 8.

Figure 10:
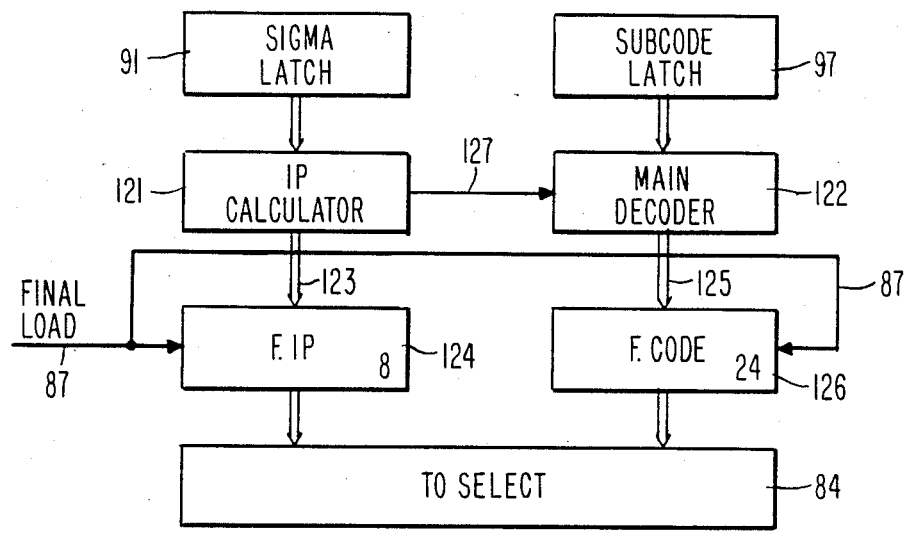
FIG. 10 is a more detailed block diagram of the record circuits which are contained in the processing elements of FIG. 5 and produce the inputs to the select circuits and form an extension of the FIG. 6 structure.

Refer now to FIG. 10 which is a more detailed block diagram of the record circuit which is contained in the processing element 76 of FIG. 5 which produce the inputs to the select circuits 84 and form an extension to FIG. 6. The record circuits comprise an inner product calculator 121 and a main decoder 122 which are coupled to the aforementioned sigma latch 91 and the subcode latch 97 in the processing element 76. The IP calculator 121 produces the aforementioned inner product value (IP) on bus 123 which is stored in inner product register 124 before being presented to the select circuits 84. In a similar manner the main decoder 122 produces a (24,5) subcode code word on bus 125 which is stored in code register 126 before being presented to the select register 84 for final determination. The inner product calculator supplies a signal via line 127 to the main decoder 122 to determine the proper subcode code word to be stored in code register 126. The control and timing of storing the inner product and code word in register 124 and 126 are under control of the final load signal on one of the control lines 87 described hereinbefore.

Figure 11:
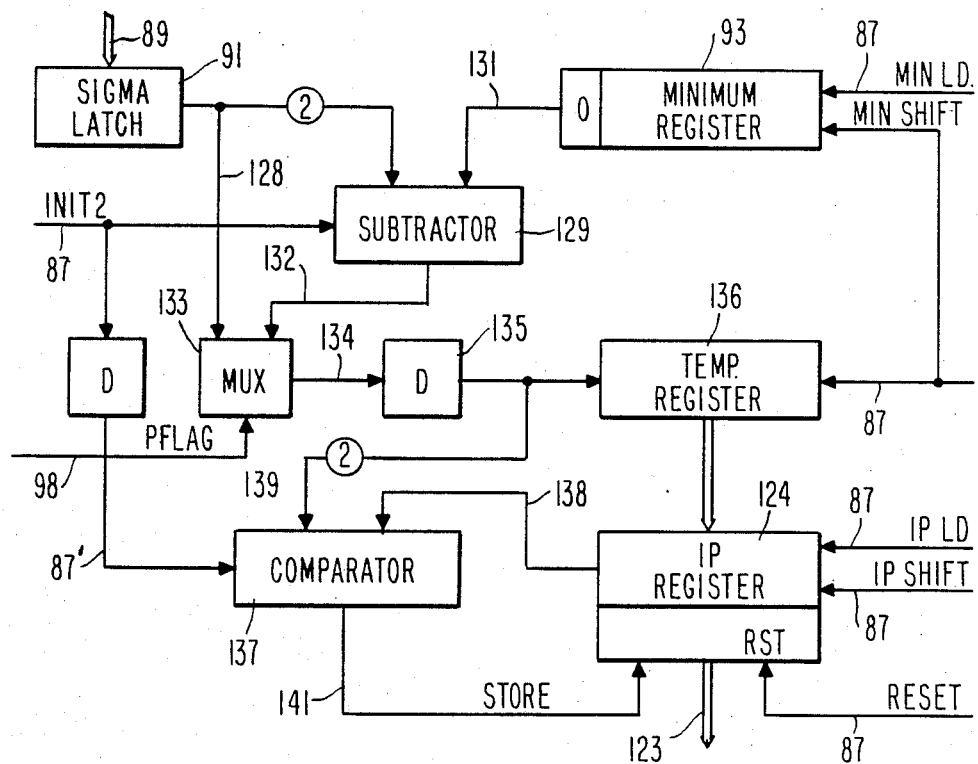
FIG. 11 is a more detailed block diagram of the structure employed to calculate the inner product values and forms a part of the processing elements of FIG. 5.

Refer now to FIG. 11 which is a more detailed block diagram of the structure employed to calculate the inner product values which forms a part of the processing element 76 of FIG. 5. The output of the sigma register 91 on line 128 is applied to the subtractor 129 along with the output of the minimum register 93 on line 131. The output on line 132 is the difference between the value in sigma latch 91 and minimum register 93. If the P-flag value on line 98 is zero to mux 133 then the signal on line 128 from sigma latch 91 is selected and appears as the ouput of mux 133 on line 134 and is delayed by delay 135 before being stored in temporary register 136. However, if the P-flag signal on line 98 is high or 1, then the output on line 132 is selected by the multiplexer 133 as the output on line 134 is delayed and stored in the temporary register 136. The largest inner product value previously calculated is stored in inner product register 124 and is supplied to comparator 137 via line 138 along with the inner product value previously stored in temporary register 136 via line 139. If the new inner product value in temporary register 136 is larger than the contents of inner product register 124, the comparator 137 supplies a control signal via line 141 which causes the contents of temporary register 136 to be stored and written over contents in inner product register 124, otherwise the contents of inner product register 124 remain unchanged. The control signal inner product load, inner product shift and the reset signal are supplied from the inner product controller via lines 87.

As explained hereinbefore, the preferred embodiment precomputation circuit of FIG. 1 is adapted to receive a 24-dimensional vector X where each of the 24 coordinates of the vector X is quantized to four digital bits. Each vector X received is representative of a code word in the extended Golay (24,12) code. The Golay (24,12) code is partitioned into (24,5) subcode with an index of 128 which is more easily decoded. Eight parallel cells are employed for the decoding of sixteen cosets of the (24,5) subcode is order to find the maximum inner product and the corresponding code word closest to the received vector X. The maximum inner product from each cell is loaded into a select logic circuit which produces as an output on bus 85 the final estimated code word. By employing six cells in the precomputational circuits and eight parallel inner product processors, the cycle time after the pipeline is filled corresponds to the time required to receive one 24-dimensional vector X and the time to produce a new decoded throughput, thus, the maximum likelihood decoder is operated in real time with a delay of 144 cycles in the decoder.

A clock rate in the range of 5 to 7.5 Mhz results in a decoded vector every 1.6 to 2.4 micro-seconds. Faster rates can be achieved employing chips with smaller feature sizes and/or replicating the circuits described hereinbefore.

According to the above explanation the novel decoder has been divided into two basic sections comprising the precomputation circuits and its associated controller and the inner product circuit and its associated controller employing basic logic elements which may be easily implemented in a very large scale integrated circuit on one or two chips depending on the density and size of the chip. The advantage of employing simple logic and replication of the logic elements insures reliability of the maximum likelihood decoder. The more regular the circuits and logic employed in the decoder the more economical the implementation of the two basic circuits which comprise the decoder.

What is claimed is:

1. An efficient maximum likelihood decoder for the Golay (24,12) code comprising:
   precomputational circuit means for receiving a dimensional vector (X) to be decoded,
   register means comprising a plurality of sets of storage registers for dividing said dimensional vector information into sets of information,
   bit serial adder means coupled to said individual sets of said registers for producing precomputed $SG_K$ values representative of said sets of information,
   random access (RAM) storage means for storing said $SG_K$ values,
   inner product circuit means comprising a plurality of processing elements,
   each of said processing elements being coupled to a part of said RAM storage means representative of sets of said $SG_K$ values,
   means for addressing and sequentially reading said precomputed $SG_K$ values out of said random access storage means into said inner product circuit means,
   means for comparing said $SG_K$ values and for determining a minimum $SG_K$ values and the subcode values for the $SG_K$ values,
   means for determining the sign of the $SG_K$ subcode values,
   means for calculating and selecting the largest inner product values for said subcode values,
   select means for determining the single subcode value whose inner product with the received dimensional vector (X) is the largest, and
   means for presenting said subcode value as information bits associated with said subcode value to a utilization device.

2. An efficient maximum likelihood decoder as set forth in claim 1 wherein said dimension vector (X) is represented by a twenty-four dimensional vector equal $(X_{24} \ldots, X_2, X_1)$.

3. An efficient maximum likelihood decoder as set forth in claim 2 wherein said register means comprises six sets of eight registers for storing $SG_K$ values.

4. An efficient maximum likelihood decoder as set forth in claim 3 wherein said precomputational circuit means, said register means and said bit serial adder means compute 128 sets of $SG_K$ values where $SG_K = X_{4K} \pm X_{4K-1} \pm X_{4K-2} \pm X_{4K-3}$ for each of the six sets of registers.

5. An efficient maximum likelihood decoder as set forth in claim 1 wherein said inner product circuit means comprises a plurality of sets of processing elements for receiving said $SG_K$ values from said random storage means.

6. An efficient maximum likelihood decoder as set forth in claim 5 wherein said processing elements each comprise means for checking parity of said $SG_K$ values.

7. An efficient maximum likelihood decoder as set forth in claim 5 wherein said processing elements each comprise means for comprising $SG_K$ values and determining the minimum magnitude $SG_K$ value.

8. An efficient maximum likelihood decoder as set forth in claim 7 wherein said processing elements each comprise means for determining a subcode value associated with each minimum magnitude $SG_K$ value.

9. An efficient maximum likelihood decoder as set forth in claim 5 wherein said processing elements each comprise means for determining an inner product (IP) value equal to the sum of the absolute values of the $SG_K$ values.

10. An efficient maximum likelihood decoder as set forth in claim 9 wherein said inner product value $IP = |SG_1^{(j)}| + ---+ |SG_6^{(j)}|$ where $K=1$ to 6 and $j=0$ to 127.

11. An efficient maximum likelihood decoder as set forth in claim 10 wherein said processing elements each comprise means for determining the maximum inner product (IP) value and the (24,5) subcode having the maximum inner product value.

12. An efficient maximum likelihood decoder as set forth in claim 10 wherein said dimensional vector (X) is decoded as a (24,5) subcode to find the maximum inner product and the corresponding code word closest to the received vector (X).

13. An efficient maximum likelihood decoder as set forth in claim 5 wherein said processing elements each comprise bit serial adders and parity checkers coupled to a subcode decoder for determining a subcode value.

14. An efficient maximum likelihood decoder as set forth in claim 13 which further comprises a subcode latch for storing said subcode value.

15. An efficient maximum likelihood decoder as set forth in claim 14 which further comprises a main decoder coupled to said subcode latch and to said means for calculating and selecting the largest inner product value.

16. An efficient maximum likelihood decoder as set forth in claim 15 wherein said main decoder decodes said subcode value as a (24,5) subcode value.

17. An efficient maximum likelihood decoder as set forth in claim 15 wherein said select logic circuit coupled to said main decoder and to said means for calculating and selecting the largest inner product value is decoded as a (24,5) code word.

18. An efficient maximum likelihood decoder as set forth in claim 17 wherein said Golay (24,12) dimensional vector (X) is selected from the decoded (24,5) code word.

* * * * *